United States Patent
Park et al.

(10) Patent No.: US 9,515,585 B2
(45) Date of Patent: Dec. 6, 2016

(54) METHOD FOR DIAGNOSING ELECTRIC WATER PUMP OF ENGINE

(71) Applicants: HYUNDAI MOTOR COMPANY, Seoul (KR); Kia Motors Corporation, Seoul (KR); MYUNG HWA IND. CO., LTD., Seoul (KR)

(72) Inventors: Jung Hoon Park, Anyang-si (KR); Kyoung Hee Kim, Ansan-si (KR); Jae Man Cho, Seoul (KR); Tae Sung Oh, Ansan-si (KR); Geun Oh Dong, Hwaseong-si (KR)

(73) Assignees: HYUNDAI MOTOR COMPANY, Seoul (KR); KIA MOTORS CORPORATION, Seoul (KR); MYUNG HWA IND. CO., LTD., Seoul (KR)

( * ) Notice: Subject to any disclaimer, the term of this patent is extended or adjusted under 35 U.S.C. 154(b) by 0 days.

(21) Appl. No.: 14/726,384

(22) Filed: May 29, 2015

(65) Prior Publication Data

US 2016/0164441 A1    Jun. 9, 2016

(30) Foreign Application Priority Data

Dec. 5, 2014 (KR) .................. 10-2014-0174480

(51) Int. Cl.
*G05B 23/02* (2006.01)
*H02P 6/12* (2006.01)
(Continued)

(52) U.S. Cl.
CPC ............ *H02P 6/12* (2013.01); *G01R 31/026* (2013.01); *G01R 31/343* (2013.01); *H02P 6/18* (2013.01)

(58) Field of Classification Search
CPC ....... A01D 34/69; A01D 69/02; G05B 23/02
USPC ......... 318/565, 528, 400.01, 400.14, 400.15, 318/779, 799, 430, 432, 437, 700, 701, 318/727; 388/909, 800, 815, 823; 701/29.1, 701/31.4, 32.7, 34.4; 714/25, 31; 417/321, 417/324

See application file for complete search history.

(56) References Cited

U.S. PATENT DOCUMENTS 6,262,550 B1 *  7/2001  Kliman .............. G05B 23/0264
                                                            318/565
8,362,732 B2 *  1/2013  Anwar ................... G01R 31/06
                                                            318/490

(Continued)

FOREIGN PATENT DOCUMENTS

JP    6-245301 A     9/1994
JP    H10-164890 A   6/1998

(Continued)

OTHER PUBLICATIONS

Notice of Allowance issued in corresponding Korean Application No. 10-2014-0174480, mailed on Apr. 27, 2016.

(Continued)

*Primary Examiner* — Antony M Paul
(74) *Attorney, Agent, or Firm* — McDermott Will & Emery LLP

(57) ABSTRACT

A method for diagnosing an electric water pump of an internal combustion engine includes determining whether a present condition is a coil-open diagnosis condition that enables diagnosis of whether any coil of a sensorless 3-phase motor used in the electric water pump is open. When the coil-open diagnosis condition is satisfied, whether a coil of one phase is open is determined by using a change in phase currents. When the coil-open diagnosis condition is satisfied, whether coils of two phases are open is determined by using a magnitude of a motor torque or a magnitude of an average phase current. When the coil-open diagnosis condition is satisfied, whether any coil of the motor is open during driving of the motor is determined by using a variation in the motor torque.

9 Claims, 2 Drawing Sheets

(51) Int. Cl.
  *H02P 6/18* (2016.01)
  *G01R 31/34* (2006.01)
  *G01R 31/02* (2006.01)

(56) References Cited

U.S. PATENT DOCUMENTS

| | | | | |
|---|---|---|---|---|
| 8,605,471 | B2 * | 12/2013 | Ogura | H02M 7/5387 |
| | | | | 363/56.03 |
| 9,018,881 | B2 * | 4/2015 | Mao | H02P 29/0241 |
| | | | | 318/400.01 |
| 2005/0017733 | A1 | 1/2005 | Heinzmann et al. | |
| 2012/0217919 | A1 | 8/2012 | Tang et al. | |
| 2016/0134205 | A1 * | 5/2016 | Bock | H02P 1/265 |
| | | | | 318/778 |

FOREIGN PATENT DOCUMENTS

| | | |
|---|---|---|
| JP | 2000-303839 A | 10/2000 |
| JP | 2005-147672 A | 6/2005 |
| JP | 2007-244028 A | 9/2007 |
| JP | 2011-112041 A | 6/2011 |
| JP | 2013-031356 A | 2/2013 |
| KR | 10-2012-0061667 A | 6/2012 |

OTHER PUBLICATIONS

Extended European Search Report issued in corresponding European Patent Application No. 15169596.2, mailed on Jun. 3, 2016.

* cited by examiner

METHOD FOR DIAGNOSING ELECTRIC WATER PUMP OF ENGINE

CROSS REFERENCE TO RELATED APPLICATION

The present application claims the benefit of priority to Korean Patent Application Number 10-2014-0174480 filed on Dec. 5, 2014, the entire content of which application is incorporated herein for all purposes by this reference.

TECHNICAL FIELD

The present disclosure relates to a method for diagnosing an electric water pump of an engine, and more particularly, to a method for diagnosing a fault in an electric water pump of an internal combustion engine for circulating an engine coolant.

BACKGROUND

A coolant in an internal combustion engine of a vehicle circulates through a water pump so as to remove heat generated by the engine. In the past, a mechanical water pump was generally mounted to mechanically interlock a crankshaft of an engine. Recently, however, an electric water pump has been widely used, which is capable of independently and actively controlling driving of the engine in consideration of various factors such as an operation state of the engine.

Since the electric water pump is driven by an electric motor, a stable and suitable operation of the motor is necessary in order to control consistent flow of an engine coolant.

Therefore, a status of the motor for the electric water pump needs to be checked. For an electric water pump using a sensorless 3-phase motor, a controller needs to pre-diagnose whether a coil of one phase of the motor or coils of two phases thereof are open to prevent overheating of an engine.

The foregoing is intended merely to aid in a better understanding of the background of the present disclosure, and is not intended to mean that the present disclosure falls within the purview of the related art that is already known to those skilled in the art.

SUMMARY

The present disclosure has been made keeping in mind the above problems occurring in the prior art. An aspect of the present inventive concept provides a method for diagnosing an electric water pump of an internal combustion engine, which allows a controller to promptly diagnose whether any coil of a sensorless 3-phase motor used in the electric water pump is open, thus preventing a problem such as overheating of the engine occurring due to insufficient pumping of the electric water pump.

A method for diagnosing an electric water pump of an engine according to an embodiment of the present inventive concept includes determining whether a present condition is a coil-open diagnosis condition that enables diagnosis of whether any coil of a sensorless 3-phase motor used in the electric water pump is open. When the coil-open diagnosis condition is satisfied, whether a coil of one phase is open is determined by using a change in phase currents. Whether coils of two phases are open is determined by using a magnitude of a motor torque or a magnitude of an average phase current when the coil-open diagnosis condition is satisfied. When the coil-open diagnosis condition is satisfied, whether any coil of the motor is open during driving of the motor is determined by using a variation in the motor torque.

BRIEF DESCRIPTION OF THE DRAWINGS

The above and other objects, features, and advantages of the present inventive concept will be more clearly understood from the following detailed description taken in conjunction with the accompanying drawing.

DETAILED DESCRIPTION

Hereinafter, embodiments of the present inventive concept will be described in detail with reference to the attached drawings.

Figure 1:
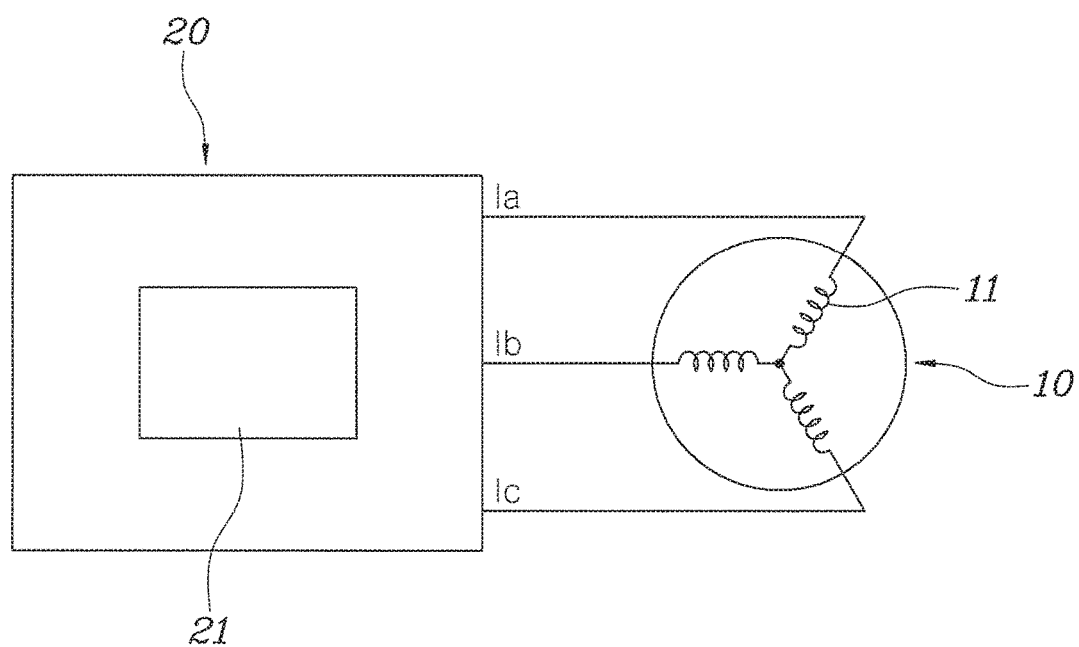
FIG. 1 is a schematic diagram showing a controller connected to a sensorless 3-phase motor in an electric water pump of an engine according to the present disclosure.
Figure 2:
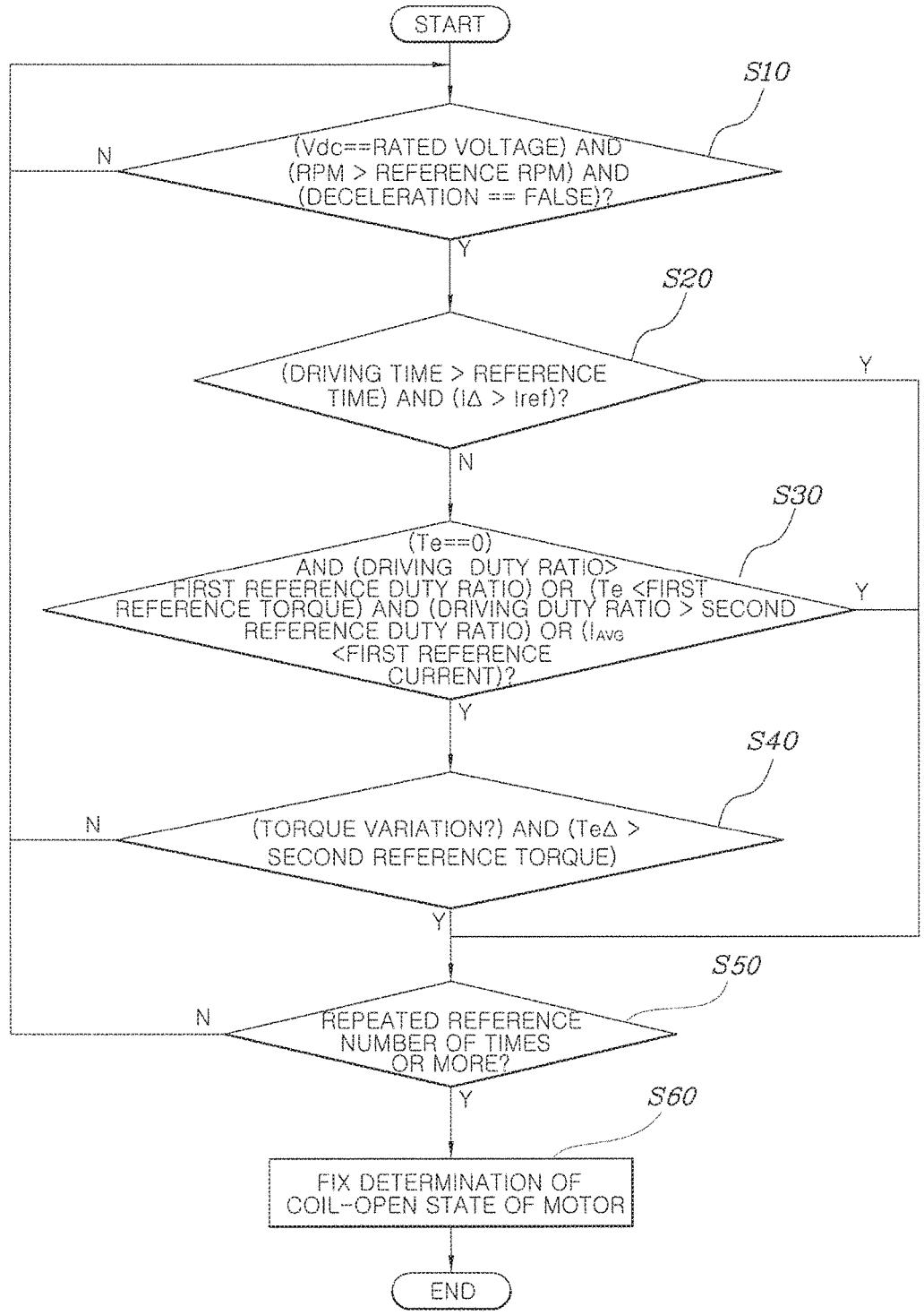
FIG. 2 is a flowchart showing a method for diagnosing an electric water pump of an engine according to the present disclosure.

FIG. 1 is a schematic diagram showing a controller connected to a sensorless 3-phase motor in an electric water pump of an engine according to the present disclosure. FIG. 2 is a flowchart showing a method for diagnosing an electric water pump of an engine according to the present disclosure.

In FIG. 1, reference numeral 20 denotes a controller, reference numeral 21 denotes a diagnosis control circuit part, reference numeral 10 denotes a 3-phase motor, and reference numeral 11 denotes a coil. The drawings and description are to be regarded as illustrative in nature and not restrictive, and like reference numerals designate like elements throughout the specification.

Referring to the FIG. 2, a method for diagnosing an electric water pump of an engine according to the present disclosure includes determining whether a present condition is a coil-open diagnosis condition that enables diagnosis of whether any coil of a sensorless 3-phase motor 10 used in the electric water pump of the engine is open in step S10. When the coil-open diagnosis condition is satisfied, whether a coil 11 of one phase is open is determined by using a change in phase currents in step S20. When the coil-open diagnosis condition is satisfied, whether coils of two phases are open is determined by using the magnitude of a motor torque or the magnitude of an average phase current in step S30. When the coil-open diagnosis condition is satisfied, whether any coil is open during driving of the motor 10 is determined by using a variation in the motor torque in step S40.

Thus, the present disclosure may determine whether any coil of the sensorless 3-phase motor 10 generating a driving force of the electric water pump is open in steps S20 through S40.

In step S10, when a rated voltage is applied to a controller 20 of the motor 10 and revolutions per minute (RPM) of the motor is greater than a reference RPM and when the motor 10 is in an acceleration state or a constant velocity state, it is determined that the coil-open diagnosis condition is satisfied. The controller 20 herein includes a diagnosis control circuit part 21 for diagnosing coils 11 (see FIG. 1).

More specifically, whether any coil of the motor 10 is open can be determined in the following cases: a case where voltage Vdc to be input to the controller 20 of the motor 10 is the rated voltage and is in a state suitable for the determination of the coil-open of the motor 10 using the controller 20; a case where the RPM of the motor 10 is greater than the reference RPM, for example 2000 RPM, and the three phases of the motor 10 are not completely disconnected or the motor 10 is not in a stall state; and a case where the motor 10 is in the acceleration state or the constant velocity state but not in a deceleration state.

Here, a drive current applied to the motor 10 is stable only when the motor 10 is in the acceleration state or constant velocity state, and thus, whether any coil of the motor 10 is open only in the acceleration state or constant velocity state but not the deceleration state is determined.

The sensorless 3-phase motor used in the present disclosure may be controlled in a sensorless field oriented control (FOC) manner.

In step S20, whether a coil 11 of one phase is open is determined if a change in phase currents is greater than the average of absolute values of the phase currents in a state in which a driving time of the motor 10 is greater than a reference time.

That is, after the reference time during which the motor 10 in a stopped state is driven and is accelerated to some degree, and it may be checked that a value of current required for motor control passes through a transition period and enters a stabilization period, if a change in phase currents $I\Delta$ is greater than the average Iref of absolute values of the phase currents, it is determined that the coil 11 of one phase of the motor 10 is open.

Therefore, the reference time is determined based on experiments and analyses. That is, it may be possible for the controller 20 of the motor 10 to change the reference time according to a target RPM of the motor requested by an external system using a functional relation, such as dividing the target RPM by a certain constant, and apply the changed reference time.

Here, the change in phase currents is given as $I\Delta$=(Ipeak−Ilow), where Ipeak is the highest current value of three phase current values Ia, Ib, and Ic, and Ilow is the lowest current value of the three phase current values Ia, Ib, and Ic.

Further, the average of the absolute values of phase currents is given as, Iref=(|Ia|+|Ib|+|Ic|)/3.

That is, when a coil 11 of any one phase of the motor 10 is open, a change in phase currents is greatly increased, so that the phase current of the open coil is compared with the average of the absolute values of phase currents, thus detecting that the coil 11 of any one phase is open.

In step S30, it is determined that coils 11 of two phases are open in three cases: a case where the torque of the motor is 0 when a driving duty ratio of the motor applied by the controller 20 is greater than a first reference duty ratio value; a case where the torque of the motor 10 is less than a first reference torque when the driving duty ratio of the motor 10 applied by the controller 20 is greater than a second reference duty ratio value greater than the first reference duty ratio value; and a case where the average phase current of the motor 10 is less than a first reference current.

Thus, when at least one of the three cases occurs, it is determined in step S30 that the coils 11 of two phases are open. However, it may be possible to select only one of the cases and determine the selected case, or determine a combined case using any combinations of the cases.

When the torque of the motor Te is 0 when the driving duty ratio of the motor applied by the controller 20 is greater than the first reference duty ratio value, for example, when the motor torque Te is 0 while the driving duty ratio of the motor is applied at 15%, it may be determined that the motor is not being operated even if drive current is applied to the motor, and then, the coils 11 of two phases are open.

Next, when the motor torque is less than the first reference torque in the state in which the driving duty ratio of the motor applied by the controller 20 is greater than the second reference duty ratio value, that is, greater than the first reference duty ratio value. For example, when the motor torque Te is less than the first reference torque (e.g., 0.015 Nm) and is regarded as being not generated even if the driving duty ratio is equal to or greater than 25% when the first reference duty ratio value is set to 15%, and the second reference duty ratio value is set to 25% greater than the first reference duty ratio value, it may be determined that the coils 11 of two phases are open.

Further, when the average phase current of the motor $I_{AVG}$ is less than the first reference current, for example, when a value of $I_{AVG}$=(Ia+Ib+Ic)/3 is less than the first reference current (e.g., 0.3 A) indicating a state in which some of current flows through the coils 11 of the motor 10, it may also be determined that the coils 11 of two phases are open.

In step S40, when the torque of the motor varies and a variation in the motor torque Te$\Delta$ is greater than the second reference torque, it is determined that any coil of the motor 10 is open during the driving of the motor 10.

That is, when the motor torque varies during the driving of the motor 10 and the torque variation Te$\Delta$ is greater than a predetermined level, it may be determined that any coil of the motor 10 is open during the driving of the motor 10. In this case, the torque variation Te$\Delta$ is obtained as a difference between the torque of the present control cycle of the controller 20 and the torque of the previous control cycle of the controller 20. The second reference torque may be determined based on a plurality of experiments and analyses and may be set to, for example, a value varying with a change in the target RPM of the motor, in the form of a function that is determined by adding, subtracting, multiplying, or dividing a constant with respect to a target RPM of the motor.

For example, the second reference torque may be set to a function such as, "second reference torque=(target RPM−2000)/1000)+3".

Here, the motor torque is a value calculated from currents flowing through the motor.

The method of the present disclosure may repeat, multiple times, steps S10 through S40, in step S50. If it is repetitively determined a reference number of times or more that any coil of the motor 10 is open in step S50, the determination of such a coil-open state is fixed as a final coil-open state in step S60, thus enabling the coil-open state of the motor 10 to be more reliably and precisely determined.

For example, the reference number of times may be defined so that, when the same determination results have been successively obtained several tens of times, for example, 20 to 50 times, the determination of the coil-open state of the motor is finally fixed, and thus, separate actions may be taken in such a way as to warn a driver of a state of the motor or restrict a driving mode of the vehicle.

As described above, the present disclosure allows a controller to promptly diagnose whether any coil of a sensorless 3-phase motor used in an electric water pump is open, thus ultimately preventing a problem such as the overheating of an engine occurring due to insufficient pumping of the electric water pump.

Although specific embodiments of the present inventive concept have been disclosed for illustrative purposes, those skilled in the art will appreciate that various modifications, additions, and substitutions are possible, without departing from the scope and spirit of the invention as disclosed in the accompanying claims.

What is claimed is:

1. A method for diagnosing an electric water pump of an internal combustion engine, comprising steps of:
   a) determining whether a present condition of the electric water pump is a coil-open diagnosis condition that enables diagnosis of whether any coil of a sensorless 3-phase motor used in the electric water pump is open;
   b) determining whether a coil of one phase is open by using a change in phase currents when the coil-open diagnosis condition is satisfied;
   c) determining whether coils of two phases are open by using a magnitude of a motor torque or a magnitude of an average phase current when the coil-open diagnosis condition is satisfied; and
   d) determining whether any coil of the motor is open during driving of the motor by using a variation in the motor torque when the coil-open diagnosis condition is satisfied.

2. The method of claim 1, wherein step a) comprises determining that the coil-open diagnosis condition is satisfied if a rated voltage is applied to a controller of the motor, a revolutions per minute (RPM) of the motor is greater than a reference RPM, and the motor is in an acceleration state or a constant velocity state.

3. The method of claim 2, wherein step b) comprises determining that the coil of the one phase is open if the change in the phase currents is greater than an average of absolute values of the phase currents when a driving time of the motor is greater than a reference time.

4. The method of claim 2, wherein step c) comprises determining that the coils of the two phases are open if the motor torque is 0 when a driving duty ratio of the motor applied by the controller is greater than a first reference duty ratio value.

5. The method of claim 4, wherein step c) further comprises determining that the coils of the two phases are open if the motor torque is less than a first reference torque when the driving duty ratio of the motor applied by the controller is greater than a second reference duty ratio value that is greater than the first reference duty ratio value.

6. The method of claim 2, wherein step c) comprises determining that the coils of the two phases are open if the average phase current of the motor is less than a first reference current.

7. The method of claim 2, wherein in step c), it is determined that the coils of the two phases are open when:
   the motor torque is 0 in a state in which a driving duty ratio of the motor applied by the controller is greater than a first reference duty ratio value;
   the motor torque is less than a first reference torque in a state in which the driving duty ratio of the motor applied by the controller is greater than a second reference duty ratio value that is greater than the first reference duty ratio value; and
   the average phase current of the motor is less than a first reference current.

8. The method of claim 2, wherein step d) comprises determining that any coil of the motor is open during driving of the motor if the motor torque varies and a variation in the motor torque is greater than a second reference torque.

9. The method of claim 1, further comprising:
   repeating steps a) through d) a reference number of times or more; and
   fixing determination of a coil-open state of the motor as a final coil-open state of the motor if it is determined, after the step of repeating, that any coil of the motor is open.

* * * * *